United States Patent [19]

Higuchi et al.

[11] Patent Number: 4,479,126
[45] Date of Patent: Oct. 23, 1984

[54] MIS DECODER CIRCUIT

[75] Inventors: Mitsuo Higuchi, Tokyo; Hideki Arakawa, Yokohama, both of Japan

[73] Assignee: Fujitsu Limited, Kawasaki, Japan

[21] Appl. No.: 393,114

[22] Filed: Jun. 28, 1982

[30] Foreign Application Priority Data

Jun. 30, 1981 [JP] Japan .............................. 56-100519

[51] Int. Cl.³ ..................... H03K 19/094; H04Q 9/00
[52] U.S. Cl. ............................ 340/825.86; 307/463; 307/449
[58] Field of Search ............... 340/825.86; 307/242, 307/465, 449, 463, 468

[56] References Cited

U.S. PATENT DOCUMENTS

| 4,099,162 | 7/1978 | von Basse | 307/463 |
| 4,292,547 | 9/1981 | Pfiester et al. | 307/463 |
| 4,401,903 | 8/1983 | Iizuka | 307/463 |

Primary Examiner—Donald J. Yusko
Attorney, Agent, or Firm—Staas & Halsey

[57] ABSTRACT

A decoder circuit, used, for example, in a semiconductor memory device, decodes an n bit address signal and selects one of $2^n$ output lines such as word lines or bit lines. In the decoder circuit, MIS transistors connected to decoded signal output lines are commonly used by adjacent decoded signal output lines, so that the area occupied by the decoder circuit is decreased and the degree of integration is increased.

8 Claims, 4 Drawing Figures

MIS DECODER CIRCUIT

BACKGROUND OF THE INVENTION (1) Field of the Invention

The present invention relates to a decoder circuit, more particularly to a decoder circuit which is used, for example, in a semiconductor memory device and in which metal insulator semiconductor (MIS) transistors are connected to decode signal output lines shared by adjacent decode signal output lines, thereby increasing the degree of integration of the integrated circuit device including the decoder circuit.

(2) Description of the Prior Art

In recent years, the memory capacity of semiconductor memory devices has become larger and the size of the memory chips thereof has become smaller. Therefore, it has become desirable to reduce the size of each circuit block therein, for example, decoder circuits such as column address decoder circuits, which select bit lines, or row address decoder circuits, which select word lines.

A conventional decoder circuit of a semiconductor memory device comprises one or more separate decoder units which are disposed side by side and each supplies a pair of decode output signals according to an input address signal. Therefore, in the conventional decoder circuit, each of the decoder units occupies a large area on the semiconductor chip and it is necessary to form isolation areas between adjacent decoder units. As a result, the degree of integration of semiconductor memory devices using the conventional decoder circuit has not been great enough. It has been impossible to further increase the degree of integration thereof.

SUMMARY OF THE INVENTION

It is the principal object of the present invention to reduce the area occupied by the decoder circuit in a semiconductor memory device and to make effective use of the chip area of a semiconductor memory device, thereby increasing the degree of integration.

In the present invention, decode signal output lines, i.e., word lines or bit lines, share MIS decode transistors connected therebetween.

According to the present invention, there is provided a decoder circuit for decoding an n bit (n is a positive integer) address signal to select one of $2^n$ output lines. The decoder circuit comprises: $2^n+2$ first MIS transistors arranged in a row for decoding a first bit of the address signal, each of the first MIS transistors having a source grounded and a drain connected to a power source via a load element, the drain being connected to one of the output lines; a first means for decoding a second bit through an m-th bit (m is a positive integer smaller than n) of the address signal, the first means comprising m−1 second MIS transistors connected in parallel with each other between drains of every other pair of adjacent first MIS transistors along the row; and a second means for decoding an (m+1)+th through an n-th bit of the address signal, the second means comprising n-m third MIS transistors connected in parallel with each other between drains of every other pair of adjacent first MIS transistors along the row, the first and second means being arranged alternately along the row.

DESCRIPTION OF THE PREFERRED EMBODIMENTS

The present invention will now be explained in comparison with a conventional decoder circuit and with reference to the attached drawings.

Figure 1:
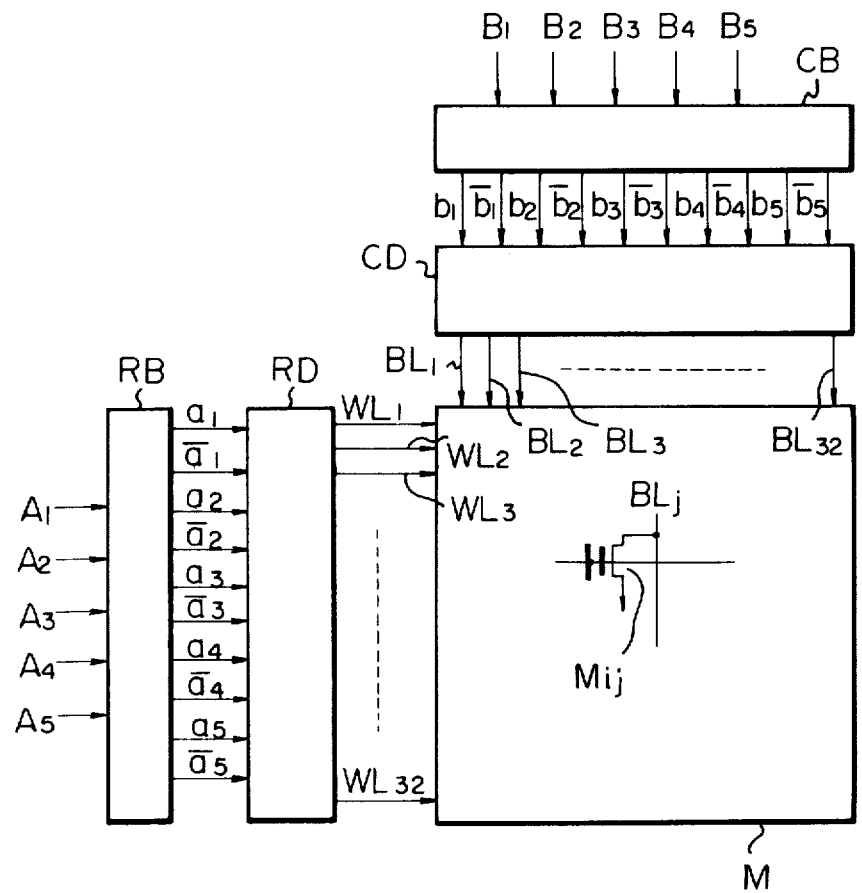
FIG. 1 is a schematic block circuit diagram of a semiconductor memory device in which decoder circuits such as a row address decoder and a column address decoder are used.

FIG. 1 illustrates an example of a semiconductor memory device which uses decoder circuits such as a row address decoder and a column address decoder. In FIG. 1, a row address buffer RB receives five bits of the input address signals A1 through A5 and outputs five pairs of bits of the buffered address signal a1 and $\overline{a1}$, a2 and $\overline{a2}$, . . . , a5 and $\overline{a5}$. One buffered address signal of each pair is a noninverted signal of the input address signal. The other buffered address signal thereof is an inverted signal of the input address signal. A row decoder RD decodes the five pairs of the buffered address signals and selects one of $2^5=32$ word lines WL1 through WL32. A column decoder CD decodes five pairs of buffered address signals b1 and $\overline{b1}$, b2 and $\overline{b2}$, . . . , b5 and $\overline{b5}$ from a column address buffer CB which receives five bits of the input address signal B1 through B5 and selects one of 32 bit lines BL1 through BL32. Thus, one of the memory cells Mij in a memory cell array M is selected, and the read-out of information from the selected memory cell or the write-in of information to the selected memory cell is effected. The present invention relates to a decoder circuit such as the row decoder RD or the column decoder CD used in the memory device of FIG. 1.

Figure 2:
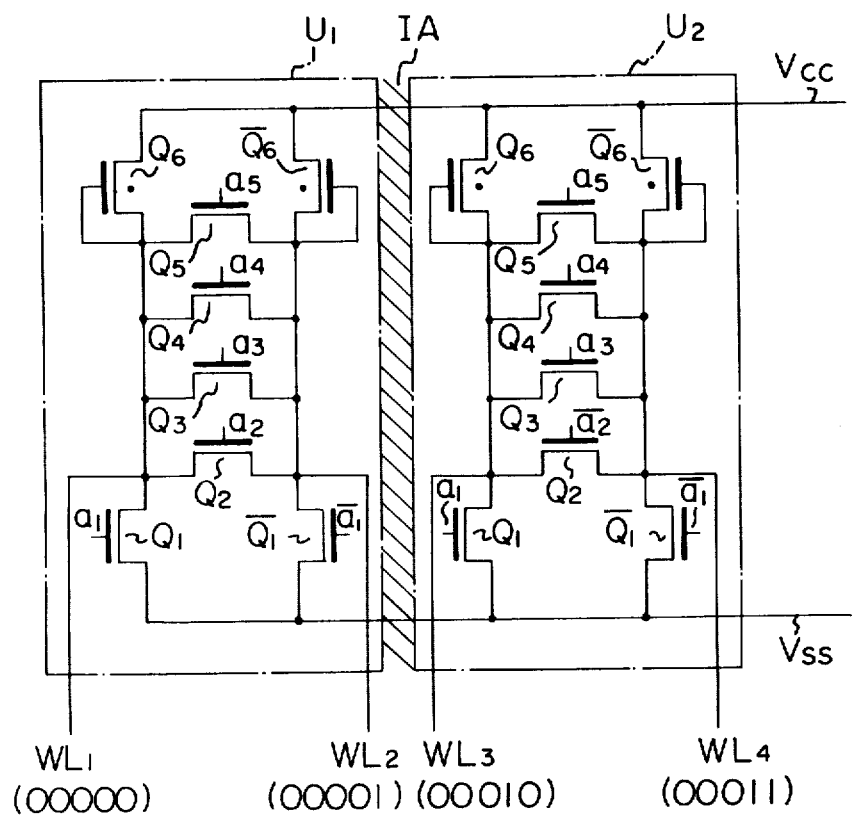
FIG. 2 is a circuit diagram of a conventional row decoder circuit.

FIG. 2 is a partial circuit diagram illustrating a conventional row decoder circuit used in an erasable programmable read only memory (EPROM) device of the type MB8516 or MB8532 made by Fujitsu Ltd. As illustrated in FIG. 2, the conventional row decoder circuit comprises a plurality of decoder units U1, U2, . . . connected in parallel between a power supply line $V_{cc}$ and a ground line $V_{SS}$. Each of the decoder units U1, U2, . . . has the same structure and comprises first bit decoding MIS transistors Q1 and $\overline{Q1}$ connected in parallel between the power supply line $V_{CC}$ and the ground line $V_{SS}$ through load transistors Q6 and $\overline{Q6}$, respectively, and second, third, fourth, and fifth bit decoding MIS transistors Q2, Q3, Q4, and Q5 connected in parallel between the drains of the transistors Q1 and $\overline{Q1}$. Different sets of address signals are applied to the gates of the transistors Q2, Q3, Q4, and Q5 according to the decoder units U1, U2, . . . For example, as illustrated in FIG. 2, the buffered address signals a2, a3, a4, and a5 are applied to the gates of the transistors Q2, Q3, Q4, and Q5 of the decoder unit U1, and the buffered address signals $\overline{a2}$, a3, a4, and a5 are applied to the gates of the transistors Q2, Q3, Q4, and Q5 of the decoder unit U2. The drain of the transistor Q1 of the decoder unit U1 is connected to the word line WL1, and the drain of the transistor $\overline{Q1}$ of the same decoder unit U1 is connected to the word line WL2. The drains of the transistors Q1 and $\overline{Q1}$ of the decoder unit U2 are connected to the word lines WL3 and WL4, respectively. The transistors Q1 and $\overline{Q1}$ of other decoder units (not shown) in FIG. 2 are connected to other word lines in a similar manner to those of the decoder unit U1 or U2.

In the decoder circuit of FIG. 2, when the buffered address signals (a5, a4, a3, a2, a1) are equal to (00000), the transistors Q1, Q2, Q3, Q4, Q5 of the decoder unit U1 are all turned off and the potential level of the word line WL1 becomes high, whereby the word line WL1 is selected. When the buffered address signals (a5, a4, a3, a2, $\overline{a1}$) are all "0", i.e., the address signals (a5, a4, a3, a2, a1) are equal to (00001), the word line WL2 is selected. In a similar manner to these word lines, each of the other word lines is selected when the buffered address signals applied to the gates of the transistors connected to the word line are all "0", i.e., low.

The degree of integration of the conventional decoder circuit of FIG. 2 is not large enough for the following reasons. First, since the conventional decoder circuit of FIG. 2 comprises a plurality of separate decoder units disposed in parallel, it is necessary to form isolation areas IA between the decoder units, as shown by the hatched region in FIG. 2. This decreases the utilization factor of the chip area of a semiconductor memory device using the decoder circuit of FIG. 2. Second, in the decoder circuit of FIG. 2, the decoding MIS transistors which decode the bits of the buffered address signal without the first bit, i.e., the transistors Q2, Q3, Q4, and Q5, are connected and disposed in parallel and, therefore, the length of the decoder circuit along the word lines, i.e., output lines, becomes large.

In a decoder circuit according to the present invention, decoding MIS transistors connected to word lines are shared by adjacent word lines, and the area occupied by the decoder circuit is reduced, thereby the degree of integration is increased.

Figure 3:
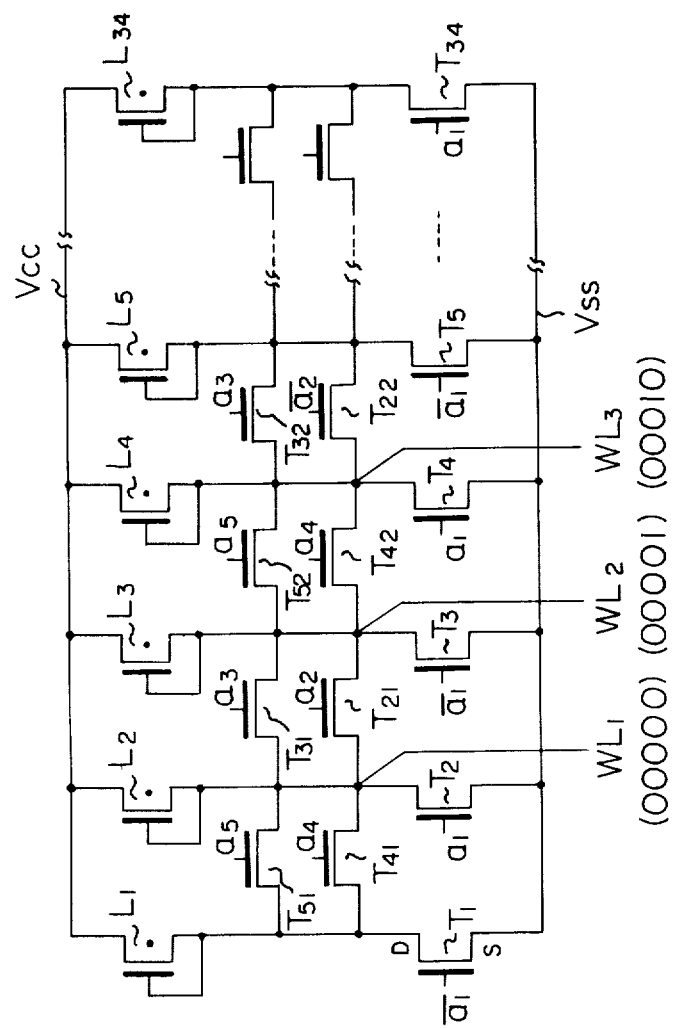
FIG. 3 is a circuit diagram of a row decoder circuit as a first embodiment of the present invention.

Embodiments of the present invention will be explained with reference to FIGS. 3 and 4. FIG. 3 illustrates a row address decoder circuit as an embodiment of the present invention, which decodes five bits of the buffered address signals a1 through a5 and inverted buffered address signals thereof $\overline{a1}$ through $\overline{a5}$ and selects one of the 32 word lines WL1 through WL32. The drains of the 34 first bit decoding MIS transistors T1, T2, T3, ..., T34 which decode the first bit a1 or $\overline{a1}$ of the buffered address signal are connected to the power supply line $V_{CC}$ through load transistors L1, L2, L3, ..., L34, respectively, which are depletion type MIS transistors whose gates and sources are commonly connected to each other. The sources of the transistors T1, T2, T3, ..., T34 are all connected to a ground line $V_{SS}$. The gates of the transistors T1, T2, T3, ..., T34 are supplied with the first bit a1 or $\overline{a1}$ of the buffered address signals. Between the drains of the transistors T1 and T2, the sources and the drains of MIS transistors T41 and T51 which decode the fourth bit a4 and the fifth bit a5 of the buffered address signal, are connected. That is, the sources and the drains of the transistors T41 and T51 are connected in parallel between the drains of the transistors T1 and T2. Between the drains of the transistors T2 and T3, the sources and the drains of MIS transistors T21 and T31 which decode the second bit a2 and the third bit a3 of the buffered address signal, are connected in parallel. Similarly, between the drains of the transistors T3 and T4, a transistor T42, which decodes the fourth bit a4, and a transistor T52, which decodes the fifth bit a5, are connected in parallel. Between the drains of the transistors T4 and T5, a transistor T22, which decodes the second bit $\overline{a2}$, and a transistor T32, which decodes the third bit a3, are connected in parallel. In general, between the drains of the transistors Ti and Ti−1 (i is a positive integer larger than 1 and smaller than 34), the sources and the drains of two MIS transistors, which decode two bits of the buffered address signal, are connected in parallel. Between the drains of the transistors Ti and Ti+1, the sources and the drains of two MIS transistors, which decode two other bits of the buffered address signal, are connected in parallel. The drains of the transistors T2 through T33 are connected to the word lines WL1 through WL32, respectively.

When the input address signal (a5, a4, a3, a2, a1) is equal to (00000), the transistors T2, T21, T31, T41, and T51 are all in a turned-off condition. Therefore, the potential of the word line WL1 is high, and the word line WL1 is selected. When the input address signal (a5, a4, a3, a2, a1) is equal to (00001), i.e., when all the bits a5, a4, a3, a2, $\overline{a1}$ are "0", the transistors T3, T42, T52, T21, and T31 are all turned off and the word line WL2 is selected. Therefore, the decoder circuit of FIG. 3 operates equivalently to the decoder circuit of FIG. 2.

It should be noted that the decoder circuit of FIG. 3 does not use separate decoder units and therefore, it is not necessary to form isolation areas therebetween. Moreover, in the embodiment of FIG. 3, the number of transistors connected in parallel between the drains of the first bit decoding transistors is two. In the conventional decoder circuit of FIG. 2, the number of transistors connected parallel between the drains of the first bit decoding transistors is four, although the number of bits of the input address signals applied to the decoder circuits of FIG. 2 and FIG. 3 are identical. Therefore, the degree of integration of the decoder circuit according to the present invention can be much larger than that of the conventional decoder circuit.

Figure 4:
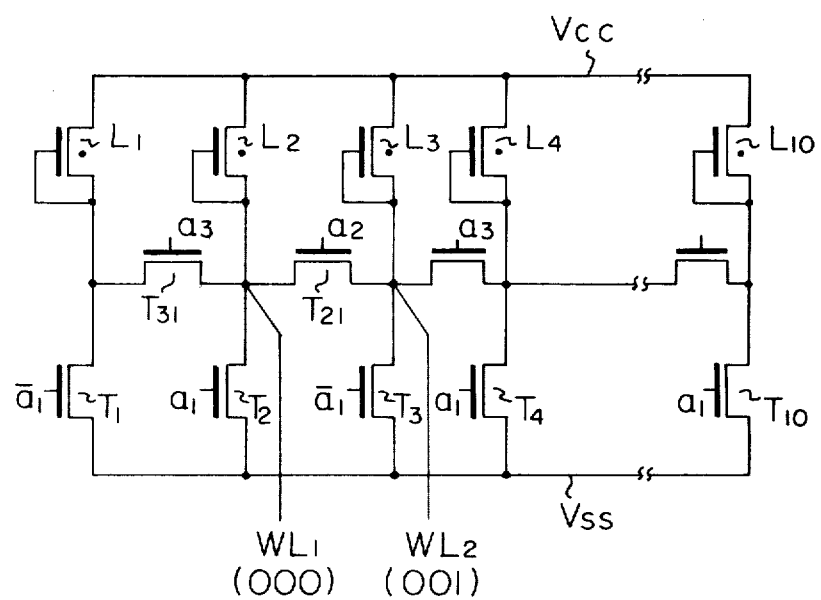
FIG. 4 is a circuit diagram of a row decoder circuit as a second embodiment of the present invention.

FIG. 4 is a partial circuit diagram illustrating a row decoder circuit as a second embodiment of the present invention. The decoder circuit of FIG. 4 functions to decode three bits a1 through a3 of the input address signal and three bits of inverted signals thereof $\overline{a1}$ through $\overline{a3}$ and to select one of $2^3 = 8$ word lines WL1 through WL8. The structure and the operation of the decoder circuit of FIG. 4 can be easily understood from the decoder circuit of FIG. 3 and, therefore, an explanation thereof is omitted. It should also be noted that the decoder circuit of FIG. 4 does not use a separate decoder unit and that the number of MIS transistors connected in parallel between the drains of the first bit decoding MIS transistors is only one, so that the degree of integration thereof can be greatly increased.

In the above explanation of the embodiments of the present invention, the row decoder circuits used in a semiconductor memory device are described. However, the present invention can also be adapted to a column decoder of a semiconductor memory device or other decoder circuits used in other devices. The bit number of an input address signal is not limited to five or three as mentioned above, but can be any number. It should also be noted that the order of the bits of the input address signal a1 through an supplied to the decoding transistors can be changed to any order.

As mentioned above, in a decoder circuit according to the present invention, MIS transistors connected between decode output lines are shared by adjacent decode output lines. Therefore, the utilization factor of the chip area can be greatly improved and the length of the decoder circuit along the output lines can be decreased, so that a high degree of integration of the decoder circuit can be achieved.

We claim:

1. A decoder circuit, having a load element operatively connected to a power source, for decoding an n bit (n is a positive integer) address signal to select one of $2^n$ output lines, said decoder circuit comprising:
   $2^n+2$ first MIS transistors arranged in a row for decoding a first bit of said address signal, each of said first MIS transistors having a source operatively connected to ground and having a drain operatively connected to the load element and one of said output lines;
   first means, operatively connected to said $2^n+2$ first MIS transistors, for decoding a second through m-th bit (m is a positive integer smaller than n) of said address signal, said first means comprising $m-1$ second MIS transistors operatively connected in parallel with each other between said drains of first alternate pairs of adjacent said first MIS transistors along said row; and
   second means, operatively connected to said $2^n+2$ first MIS transistors, for decoding an (m+1)-th through an n-th bit of said address signal, said second means comprising n-m third MIS transistors operatively connected in parallel with each other between said drains of second alternate pairs of adjacent said first MIS transistors along said row and each having a gate, said first and second means arranged alternately along said row.

2. A decoder circuit according to claim 1, wherein said load element is a depletion-type MIS transistor having a gate and source commonly connected.

3. A decoder circuit according to claim 1 or 2, wherein each of said gates of said first MIS transistors is supplied with an inverted signal of the first bit of said address signal or a noninverted signal of the first bit of said address signal.

4. A decoder circuit according to claim 3, wherein said first bit is the least significant bit of said address signal.

5. A decoder circuit according to claim 1 or 2, wherein each of said gates of said second MIS transistors is supplied with an inverted signal or a noninverted signal of one of the second through m-th bits of said address signal.

6. A decoder circuit according to claim 1 or 2, wherein each of said gates of said third MIS transistors is supplied with an inverted signal or a noninverted signal of one of the (m+1)-th through n-th bits of said address signal.

7. A decoder circuit according to claim 1, wherein said decoder circuit is a word address decoder of a semiconductor memory device and the output lines are word lines thereof.

8. A decoder circuit according to claim 1, wherein said decoder circuit is a bit address decoder of a semiconductor memory device and the output lines are bit lines thereof.

* * * * *

UNITED STATES PATENT AND TRADEMARK OFFICE
CERTIFICATE OF CORRECTION

PATENT NO. : 4,479,126
DATED : OCTOBER 23, 1984
INVENTOR(S) : MITSUO HIGUCHI ET AL.

It is certified that error appears in the above-identified patent and that said Letters Patent is hereby corrected as shown below:

Col. 2, line 54, "Q1 and Q1" should be --$Q_1$ and $\overline{Q_1}$--.

Col. 3, line 52, "al or al" should be --$a_1$ or $\overline{a_1}$--.

Signed and Sealed this

Twelfth Day of March 1985

[SEAL]

Attest:

DONALD J. QUIGG

Attesting Officer     Acting Commissioner of Patents and Trademarks